United States Patent [19]

Cheung et al.

[11] Patent Number: 4,892,844
[45] Date of Patent: Jan. 9, 1990

[54] MAKING A LOW RESISTANCE THREE LAYERED CONTACT FOR SILICON DEVICES

[75] Inventors: Robin W. Cheung, Cupertino; Bernard W. K. Ho, Fremont; Hsiang-Wen Chen, Cupertino; Hugo W. K. Chan, Fremont, all of Calif.

[73] Assignee: Advanced Micro Devices, Inc., Sunnyvale, Calif.

[21] Appl. No.: 285,188

[22] Filed: Dec. 16, 1988

Related U.S. Application Data

[62] Division of Ser. No. 858,994, May 2, 1986, Pat. No. 4,796,081.

[51] Int. Cl.[4] .................... H01L 21/00; H01L 21/02; H01L 21/90; H01L 21/306
[52] U.S. Cl. .................................... 437/194; 437/199; 437/200; 148/DIG. 19
[58] Field of Search .............................. 437/194, 200; 148/DIG. 19

[56] References Cited

U.S. PATENT DOCUMENTS

| 4,507,852 | 4/1985 | Karulkar | 437/200 |
| 4,744,861 | 5/1988 | Matsunaga et al. | 437/200 |
| 4,796,081 | 1/1989 | Cheung et al. | 437/194 |
| 4,800,177 | 1/1989 | Nakamae | 437/200 |
| 4,824,803 | 4/1989 | Us et al. | 437/194 |

FOREIGN PATENT DOCUMENTS 0009167 1/1985 Japan.
0163342 7/1987 Japan.

OTHER PUBLICATIONS

Wolf et al., Silicon Processing for the VLSI ERA, vol. 1, Lattice Press, Sunset Beach, 1986, pp. 384–399.
Gardner, D., Layered and Homogeneous Films of Aluminum and Aluminum/Silicon with Titanium and Tungsten for Multilevel Interconnects, IEEE Tran. on Elect. Dev., vol. ED-32, No. 2, Feb. 1985.

Primary Examiner—Brian E. Hearn
Assistant Examiner—Byron S. Everhart
Attorney, Agent, or Firm—Ashen, Golant, Martin & Seldon

[57] ABSTRACT

A three-layer metal contact including aluminum is provided for silicon-based semiconductor devices to minimize the effects of formation of silicon precipitates in the aluminum layer and low contact junction leakage. The metal contact comprises a first layer of a refractory metal silicide formed on a silicon surface, an intermediate layer of aluminum formed on the refractory metal silicide and a top layer of a refractory metal silicide formed on the layer of aluminum. Where contact is made to polysilicon layers forming high resistance load resistors, the metal contact of the invention prevents reduction in resistance resulting from the interdiffusion of silicon and aluminum.

8 Claims, 2 Drawing Sheets

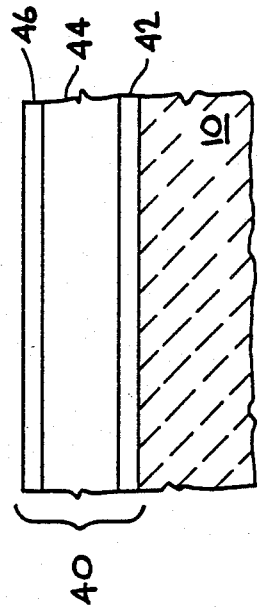
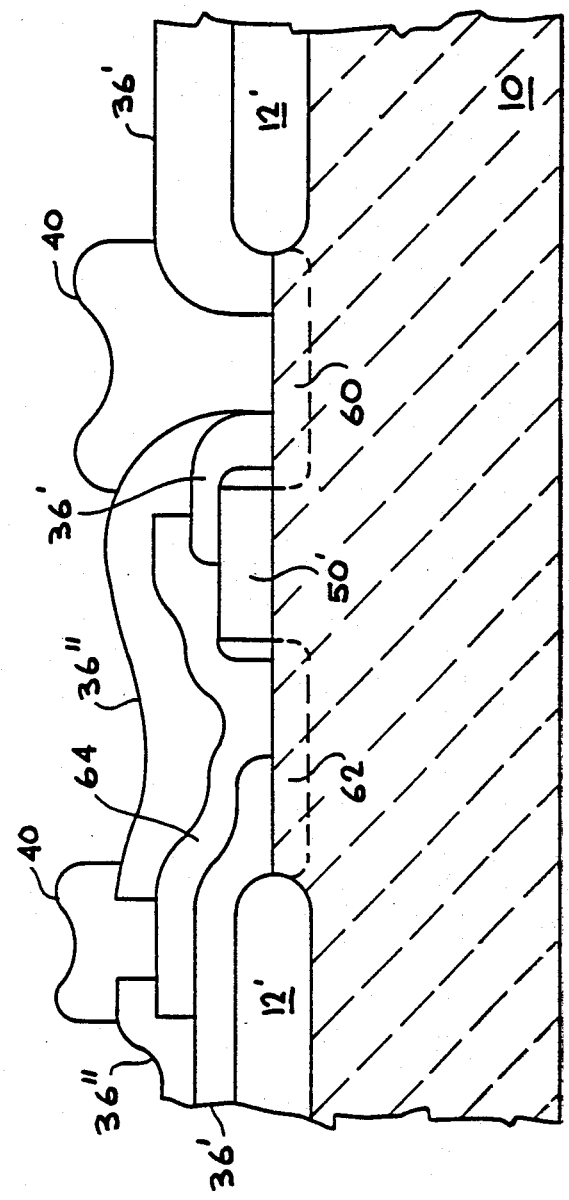

MAKING A LOW RESISTANCE THREE LAYERED CONTACT FOR SILICON DEVICES

This is a division of application Ser. No. 06/858,994, filed May 2, 1986, now U.S. Pat. No. 4,796,081.

BACKGROUND OF THE INVENTION

1. Field of the Invention

The present invention relates to semiconductors, and, more particularly, to low resistance metal contacts for silicon-based devices.

2. Description of the Related Art

The silicon/aluminum metal system has been the metal system of choice for providing metal contacts to siliconbased semiconductor devices for many years. It provides low contact resistance and is relatively stable to back end temperature treatment (e.g., sintering, incorporation in cerdip packages, and the like).

Silicon precipitates have always been associated with silicon-doped aluminum. However, since the contact opening in the past has been comparatively large, contact resistance has not been a problem.

More recently, contact openings are being made increasingly smaller as VLSI (Very Large Scale Integration) technology advances. Consequently, the silicon precipitates are becoming critical to circuit performance.

If the silicon precipitates form in the contact area, contact resistance will increase, due to a reduction in the effective contact area. In the worst case, an open contact is created.

In order to improve step coverage in forming a metal contact layer which must traverse several "steps" created during the formation and processing of various layers, a "hot" metal process is employed, as opposed to the "cold" metal process previously used. In the latter process, the metal is deposited at ambient temperatures. In the more recent hot metal process, on the other hand, the metal is deposited on a substrate maintained at an elevated temperature, typically at about 100° to 300° C.

While the contact morphology is thereby improved, the temperatures associated with the hot metal process increase the likelihood that silicon will precipitate in aluminum.

Bottom layers of metal silicides have been employed in conjunction with overlying aluminum contacts. However, most silicides cannot form a stable ohmic contact with both p+ and n+ regions, consequently limiting their use.

Hillock suppression is very important for multi-layer metal contact systems. A top layer of a metal silicide has been found to help suppress the hillock formation. However, excess silicon from the silicide creates an additional potential source for silicon precipitation in the aluminum layer.

Another problem with silicon/aluminum technology is in the area of static random access memories (RAM's) Here, polysilicon resistors are employed, which have resistances on the order of $10^9$ ohms per square. However, aluminum contacts to the polysilicon resistors are very sensitive to even low temperature annealing. An anneal at 400° C. for 90 minutes is enough to reduce the resistance to $10^4$–$10^7$ ohms and thereby cause very high leakage through the polysilicon load resistors, due to the interdiffusion of silicon and aluminum. Such a drastic change in resistance poses yield/product reliability problems and limits the potential layout advantages of using metal as a $V_{cc}$ line with direct contact to the lightly doped polysilicon resistor load.

It is clear that an improved metal contact configuration is desired, in order to reduce the effects of the formation of silicon precipitates in silicon/aluminum metal contacts.

SUMMARY OF THE INVENTION

Accordingly, it is an object of the present invention to provide a metal contact configuration for silicon-based semiconductor devices in which the effects of any silicon precipitation are minimized.

It is another object of the present invention to provide a metal contact system that is more stable to back-end temperatures than present metal contact systems.

It is a further object of the present invention to provide a barrier/buffer layer between the aluminum and underlying undoped polysilicon resistor load, so that by eliminating or at least reducing the silicon and aluminum interdiffusion, a polyload module can be formed for the static random access memory cells by using aluminum as the $V_{cc}$ line, with direct contact to the undoped polyload.

It is a still further object of the present invention to provide a low leakage junction contact.

It is yet another object of the present invention to provide a high electromigration resistance (contacts and lines) metal system.

It is still another object of the present invention to simplify the process of forming and patterning metal contact layers.

Briefly, in accordance with the invention, an improved contact metallization is provided. The contact metallization comprises three layers formed on the silicon substrate: a first layer of a refractory metal silicide, an intermediate layer of aluminum and a top layer of a refractory metal silicide. The contact structure of the invention provides a shunt conducting path, thus minimizing the effects of any silicon precipitates in the aluminum layer and enhancing the electromigration resistance.

The metallic contact of the invention is easily formed and patterned, and makes ohmic contact to both n+ and p+ regions. The metallic contact is more stable to back-end processing conditions than present aluminum contacts and prevents polysilicon resistor leakages in static RAMs.

Other objects, features and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings, are intended to illustrate only one portion of an integrated circuit fabricated in accordance with the present invention.

FIG. 3 depicts in detail a portion of FIG. 2; and

FIG. 4 depicts, in cross-section, a static RAM cell utilizing the contact metallization of the invention.

DETAILED DESCRIPTION OF THE INVENTION

Reference is now made in detail to a specific embodiment of the present invention, which illustrates the best mode presently contemplated by the inventors for practicing the invention. Alternative embodiments are also briefly described as applicable.

Figure 1:
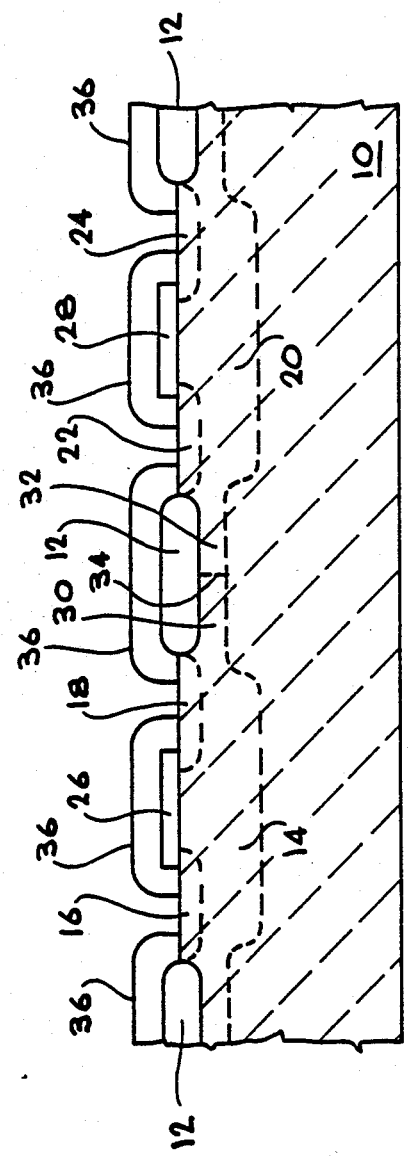
FIG. 1 depicts, in cross-section, a portion of a semiconductor wafer having formed thereon active areas to be contacted by metallization.
Figure 2:
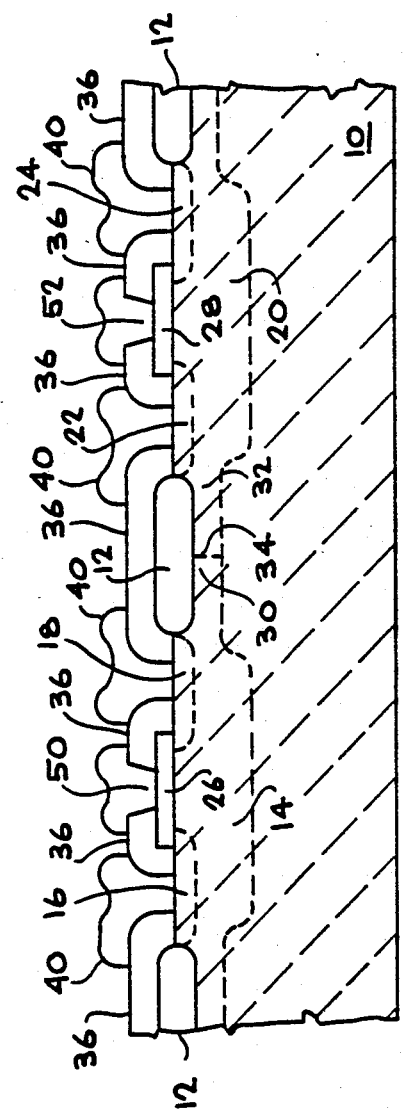
FIG. 2 depicts the device of FIG. 1 having the contact metallization of the invention formed thereon.

FIGS. 1 and 2 depict two stages in the processing of a semiconductor device on a silicon wafer, here, a CMOS (Complementary Metal Oxide Semiconductor) device, before and following formation of the contact metallization of the invention, respectively. It will be appreciated that while a CMOS device is used to illustrate the invention, the contact metallization disclosed herein may be used in any of the semiconductor device technologies employing silicon where silicon/aluminum metallization has been customarily employed.

The CMOS device is formed on a semiconductor substrate 10, preferably silicon. However, if it is intended that an epitaxial layer of silicon be used to form the devices, then the nature of the substrate is immaterial. In any event, the silicon substrate in which the devices will be formed is lightly doped with n-type atoms, about $5 \times 10^{14}$ cm$^{-3}$, over which has been formed a dielectric layer 12, preferably silicon oxide. The dielectric layer 12 is usually referred to as the field oxide and is typically formed to a thickness of about 4,000 to 9,000 Ångstroms (Å). Of course, p-type material could alternately be employed as the substrate 10.

As is conventional, openings are formed in the layer 12 by masking and etching to define n-channel and p-channel regions, in each of which will be formed source, drain and channel regions of NMOS and PMOS devices, respectively. The regions are doped to provide a p-well 14, with its associated source (n+) 16 and drain (n+) 18 regions and an n-well 20, with its associated source (p+) 22 and drain (p+) 24 regions. Gate oxide 26 is formed over the n-channel region 14 between the source 16 and drain 18 regions, while gate oxide 28 is formed over the p-channel region 20 between the source 22 and drain 24 regions. In this embodiment, channel stop regions 30 and 32, mutually self-aligned at 34, are provided. A dielectric layer 36, such as CVD silicon dioxide, is formed and patterned to provides isolation of the gate and to define contact openings to source and drain regions, and to the gate, if needed. The processing of such devices is well-known in the art and forms no part of this invention.

In accordance with the invention, a metal contact 40 is provided. Briefly, as shown in FIG. 3, the metal contact comprises three layers: a first layer of a refractory metal silicide 42, an intermediate layer of aluminum 44 and a top layer of a refractory metal silicide 46.

The metal contact 40 of the invention is advantageously employed where contact to silicon is to be made. Accordingly, the source regions 16 and 22 and drain regions 18 and 24 are contacted by the metal contact 40 through the openings in the dielectric 36. While the metal contact 40 could be used to contact the gate electrode regions 26 and 28, such is not necessary, and polysilicon contacts 50 and 52, respectively, may be employed, as is conventional.

Examples of refractory metal silicides suitably employed in the practice of the invention for layers 42 and 46 include molybdenum, tungsten, titanium and tantalum. Preferably, the refractory metal silicide comprises molybdenum silicide, $MoSi_2$.

The thickness of each refractory metal silicide layer 42 and 46 ranges from about 500 to 2,000 Å, and preferably about 1,000 to 1,100 Å. The minimum thickness of the lower layer 42 is particularly critical; less than about 500 Å is too thin and permits silicon and aluminum interdiffusion. The aluminum displaced thereby diffuses into the silicon substrate 10 to form leaky junctions and/or junction spikes. The result is that the purpose of the invention, namely, providing a low resistance, low leakage contact, is defeated.

The maximum thickness of the refractory metal silicide layers 42 and 46 is constrained by the adequacy of step converage, which diminishes with increased thickness.

The intermediate aluminum layer 44 is preferably doped with silicon to limit the solubility of silicon from the substrate therein and with copper to improve the electromigration properties thereof.

As is conventional, the silicon dopant is present up to about 1%.

As is also conventional, the copper dopant is present up to about 4%. More than about 4% renders the aluminum difficult to dry etch (i.e., plasma etch) and readily causes corrosion. Preferably, about 0.5% copper is employed.

The thickness of the intermediate aluminum layer 44 is about 4,000 Å. This results in a total thickness of the multi-layer structure of at least about 5,000 Å, which is sufficient for certain military specification standards.

The process of depositing the three layers 42, 44 and 46 comprises sputtering each layer in turn, etching the composite structure 40 to define the contact pattern and sintering. The particular parameters employed are those commonly employed in forming metal contacts.

The layers are sputtered with the substrate maintained at elevated temperatures, typically at about 100° to 300° C. This hot metal deposition process provides improved step coverage, as is well-known.

The three layers are patterned to define the contact metallization, employing conventional resist and etching technology. The resist may be deposited on top of the top layer 46 and patterned to expose portions of the underlying composite structure 40 to be removed. The exposed portions are then etched away, either by a wet chemical etch or, more preferably, by a dry plasma etch, using chlorine chemistry.

The patterned metal contact 40 is then sintered in an oxygen-free atmosphere, such as hydrogen or forming gas. Typically, the temperatures employed range from about 400° to 450° C., with times ranging from about 45 minutes to 2 hours.

FIG. 4 depicts a cross-section of a conventional static RAM cell with a resistor load, but employing the metal contact 40 of the invention in place of the conventional polysilicon $V_{cc}$ contact.

A p-type substrate 10' is provided with source and drain regions 60 and 62, respectively. A polysilicon gate 50' formed above the n-channel. A polysilicon resistor 64 is connected in series with the drain region 62. The polysilicon resistor may be undoped or slightly doped (about 4 to $8 \times 10^{13}$ cm$^{-2}$) for sheet resistance control, as is well-known.

The metal contact 40 of the invention is formed orthogonal to the polysilicon resistor. Use of the metal contact of the invention prevents interaction between the polysilicon resistor and the aluminum layer, thereby preserving the high resistance of the resistor.

So long as the back-end temperatures for any device employing the metal contact 40 do not exceed about 450° C. for more than about 14 hours, then the effects of silicon/aluminum interdiffusion appears to be minimal. Higher temperatures will require shorter times, and longer times may be utilized at lower temperatures. The determination of appropriate back-end processing times and temperatures in minimizing silicon precipitations in the metal contact 40 of the invention requires no undue experimentation.

By keeping back-end processing conditions within the constraints mentioned above, barrier layers, which require additional processing steps to form and which are generally difficult to remove, as discussed above, are eliminated. Thus, use of the metal contact of the invention simplifies processing. Further, use of refractory metal silicides permits forming ohmic contacts with both p+ and n+ regions, thereby making the metal contact of the invention more versatile than many other contact systems.

Finally, by using both top and bottom refractory metal silicides as disclosed herein, any silicon precipitates that do form in the aluminum layer are inconsequential. The combination of the three layers provides a shunt conducting path, which bypasses such precipitates in the contact, and a highly electromigration-resistant conducting layer.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for forming an improved metal contact to conducting regions of a silicon-based semiconductor device formed on a surface of a silicon substrate, said contact formed through openings in a dielectric layer to said conducting regions underlying said dielectric layer, said process comprising:
   (a) forming a composite metal contact comprising
      (1) forming a first layer of a refractory metal silicide everywhere on said dielectric layer, including in said openings,
      (2) forming a second layer of aluminum on said refractory metal silicide,
      (3) forming a top layer of a refractory metal silicide on said layer of aluminum;
   (b) patterning said composite contact; and
   (c) sintering said composite contact.

2. The process of claim 1 wherein said refractory metal silicide includes a refractory metal selected from the group consisting of molybdenum, tungsten, titanium and tantalum.

3. The process of claim 2 wherein said refractory metal comprises molybdenum.

4. The process of claim 1 wherein said refractory metal silicide ranges in thickness from about 500 to 2,000 Å.

5. The process of claim 4 wherein said thickness of said refractory metal silicide is about 1,000 to 1,100 Å.

6. The process of claim 1 wherein said refractory metal silicides and said aluminum are deposited on said substrate at an elevated temperature.

7. The process of claim 6 wherein said refractory metal silicides and said aluminum are deposited by sputtering appropriate materials on a substrate maintained at a temperature ranging from about 100° to 300° C.

8. The process of claim 6 wherein said contact is subsequently sintered in an oxygen-free atmosphere at a temperature less than about 450° C. for a time less than about 2 hours.

* * * * *